US008692457B2

(12) United States Patent
Aurongzeb et al.

(10) Patent No.: US 8,692,457 B2
(45) Date of Patent: Apr. 8, 2014

(54) LARGE AREA LIGHT EMITTING ELECTRICAL PACKAGE WITH CURRENT SPREADING BUS

(75) Inventors: Deeder Aurongzeb, Mayfield Heights, OH (US); James Michael Kostka, Mayfield Heights, OH (US)

(73) Assignee: General Electric Company, Schenectady, NY (US)

( * ) Notice: Subject to any disclaimer, the term of this patent is extended or adjusted under 35 U.S.C. 154(b) by 365 days.

(21) Appl. No.: 12/972,913

(22) Filed: Dec. 20, 2010

(65) Prior Publication Data

US 2012/0153812 A1    Jun. 21, 2012

(51) Int. Cl.
*H01L 51/50*    (2006.01)
*H01L 51/52*    (2006.01)

(52) U.S. Cl.
USPC .......................................... 313/506; 313/504

(58) Field of Classification Search
USPC ............... 313/498–512, 582–587; 315/169.1, 315/169.3
See application file for complete search history.

(56) References Cited

U.S. PATENT DOCUMENTS

| | | |
|---|---|---|
| 7,049,757 B2 | 5/2006 | Foust |
| 7,307,278 B2 | 12/2007 | Liu |
| 2003/0170491 A1 | 9/2003 | Liao |
| 2004/0046197 A1 | 3/2004 | Schaepkens et al. |
| 2004/0119403 A1 | 6/2004 | McCormick et al. |
| 2004/0121508 A1 | 6/2004 | Foust |
| 2005/0093001 A1 | 5/2005 | Liu et al. |
| 2005/0224935 A1 | 10/2005 | Schaepkens |
| 2005/0264185 A1 | 12/2005 | Hoffmann |
| 2006/0134822 A1 | 6/2006 | Liu |
| 2007/0128465 A1 | 6/2007 | Liu |
| 2008/0008887 A1 | 1/2008 | Liu |
| 2008/0252205 A1 | 10/2008 | Young |
| 2009/0206761 A1 | 8/2009 | Heller |
| 2009/0286010 A1 | 11/2009 | Erlat |
| 2010/0148661 A1 | 6/2010 | Farquhar |

(Continued)

FOREIGN PATENT DOCUMENTS

| | | |
|---|---|---|
| DE | 102006039789 A1 | 2/2008 |
| WO | 2007036850 A2 | 4/2007 |
| WO | 2007115651 A1 | 10/2007 |
| WO | 2008023008 A1 | 2/2008 |

OTHER PUBLICATIONS

PCT Search Report and Written Opinion from corresponding Application No. PCT/US2011/061409 dated Feb. 1, 2012.

*Primary Examiner* — Nimeshkumar Patel
*Assistant Examiner* — Jose M Diaz
(74) *Attorney, Agent, or Firm* — Peter T. DiMauro; GE Global Patent Operation

(57) ABSTRACT

Disclosed herein is a light emitting electrical package having a first electrode layer comprising a substantially transparent nonmetallic conductive material, and a plurality of light emitting elements disposed on said first electrode layer. The first electrode layer comprises a peripheral region, and an elongated bus is disposed on at least a portion of the peripheral region and adjacent the first electrode layer. The elongated bus is configured to spread current across a length dimension of said first electrode layer. Also disclosed are elongated bus structure designed intended to reduce the resistive losses along a transparent nonmetallic conductive contact at its edge or periphery. One design for an elongated bus comprises: (1) a conductive adhesive/metal foil/conductive adhesive sandwich structure; (2) another design comprises a vapor deposited bus of one or more materials; and a further design employs (1) and (2) in tandem.

14 Claims, 6 Drawing Sheets

(56) References Cited

U.S. PATENT DOCUMENTS

2010/0148665 A1 6/2010 Farquhar
2010/0156276 A1 6/2010 Frank
2010/0294526 A1 11/2010 Farquhar
2010/0295443 A1* 11/2010 Roberts et al. ............... 313/504
2010/0296261 A1* 11/2010 Gorczyca et al. ............. 361/820

* cited by examiner

LARGE AREA LIGHT EMITTING ELECTRICAL PACKAGE WITH CURRENT SPREADING BUS

FIELD OF THE INVENTION

The present disclosure relates to light emitting electrical packages, and particularly the present disclosure relates organic light emitting electrical packages with enhanced current spreading along a transparent conductive electrode.

BACKGROUND

Organic light emitting diode devices, or OLED devices, are generally known in the art. An OLED device typically includes one or more organic light emitting layer(s) disposed between electrodes. For example, first and second electrodes, such as a cathode and a light transmissive anode are formed on a substrate. Light is emitted when current is applied across the cathode and anode. As a result of the electric current, electrons are injected into the organic layer from the cathode and holes may be injected into the organic layer from the anode. Electrons and holes generally travel through the organic layer until they recombine at a luminescent center, typically an organic molecule or polymer. The recombination process results in the emission of a light photon usually in the visible region of the electromagnetic spectrum.

The layers of an OLED are typically arranged so that the organic layers are disposed between the cathode and anode layers. As photons of light are generated and emitted, the photons move through the organic layer. Those that move toward the cathode, which generally comprises a metal, may be reflected back into the organic layer. Those photons that move through the organic layer to the light transmissive anode, and finally to the substrate, however, may be emitted from the OLED in the form of light energy. Light transmissive anodes have been composed of substantially transparent nonmetallic conductive materials, such as indium tin oxide. Of course, additional, optional layers may or may not be included in the light source structure.

For many purposes, one may desire light emitting or OLED devices to be generally flexible, i.e., are capable of being bent into a shape having a radius of curvature of less than about 10 cm. These light emitting devices are also preferably large-area, which means they have a dimension of an area greater than or equal to about 10 cm$^2$, and in some instances are coupled together to form a generally flexible, generally planar OLED panel comprised of one or more OLED devices, which has a large surface area of light emission. Such panels should be hermetically sealed since moisture and oxygen have an adverse impact on the OLED device. It is desired that an electrical pathway be established with the light emitting panel, and also that the electrical pathway maintain flexibility, be easily and accurately positioned, establish good electrical continuity, and maintain a thin profile.

However, especially for large area OLED panels, it is also generally desired to ensure that the brightness of such panels be uniform, since nonuniformity can sometimes be sensed visually. One known possible failure mode includes ingress of moisture and/or oxygen over time. The effect of moisture and oxygen ingress may sometimes be visually observed as dark spots that form in the light emitting area. Good adhesive sealing methods and barrier methods, as well as gettering, have served well to mitigate this failure mode.

Nevertheless, it may be desirable to minimize other factors which can detract from the light output and aesthetic appearance of large area, planar, flexible OLED devices.

BRIEF SUMMARY OF THE INVENTION

One embodiment of the present invention is directed to a light emitting electrical package. The light emitting electrical package comprises a first electrode layer comprising a substantially transparent nonmetallic conductive material, and a plurality of light emitting elements disposed on said first electrode layer. The plurality of light emitting elements define a luminous region of the package, when energized. The first electrode layer comprises a peripheral region, and an elongated bus is disposed on at least a portion of the peripheral region and adjacent the first electrode layer. The elongated bus is configured to spread current across a length dimension of said first electrode layer.

A further embodiment of the present invention is directed to a large area conformal light emitting electrical package, which comprises a generally planar anode layer comprising a transparent conductive oxide, and a plurality of organic light emitting elements disposed on the anode layer. At least one of the light emitting elements comprises an organic electroluminescent layer and a cathode layer. The plurality of light emitting elements define a luminous region of the package, when energized. The anode layer further comprises a nonluminous peripheral region, and an elongated bus is disposed on at least a portion of the nonluminous peripheral region and adjacent the anode layer. The elongated bus comprises a bus material having a work function which is within about 30% of the electron affinity of the transparent conductive oxide. The elongated bus is configured to spread current across a length dimension of the anode layer.

Other features and advantages of this invention will be better appreciated from the following detailed description.

BRIEF DESCRIPTION OF THE DRAWINGS

Embodiments of the invention will now be described in greater detail with reference to the accompanying Figures.

DETAILED DESCRIPTION

Figure 1:
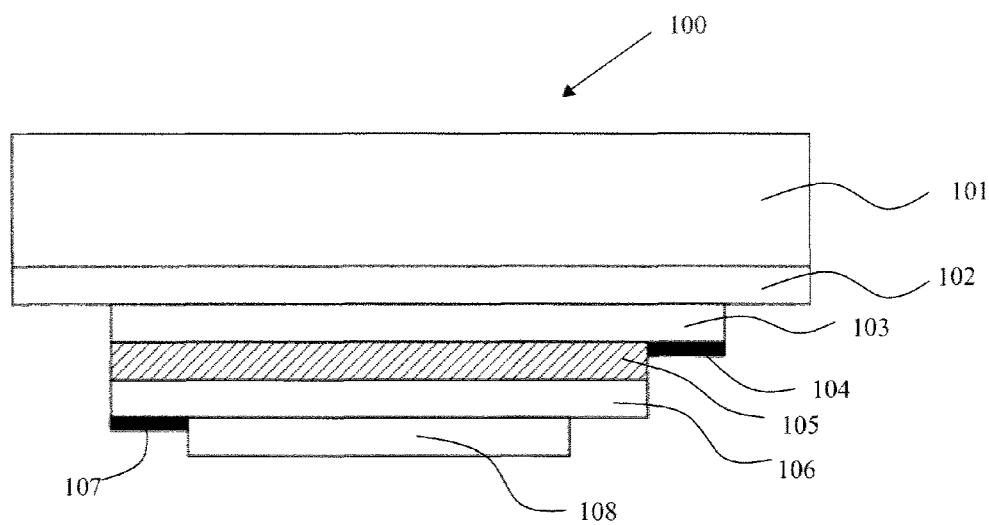
FIG. 1 depicts a sectional view of a typical light emitting element.

Applicants of the present invention have found that there may sometimes be a problem with large area, planar flexible OLED devices that employ transparent anodes. As such devices become large, current may not always be effectively spread from the point of current injection into the transparent anode layer, due to the relatively high sheet resistance for most transparent nonmetallic conductive materials, such as indium tin oxide (ITO). The current level may be high at the point of current injection, but is lowered elsewhere due to this sheet resistance. This sheet resistance can be as high as 50 ohm/sq or higher.

Current spreading along the transparent anode layer in the OLED presents a brightness uniformity issue for large-area devices. This creates areas of localized high current where a contact pad is connected to the external circuit, which results in those areas having an increase in luminance compared to the rest of the device. The relatively high sheet resistance of the ITO may cause a large $i^2R$ loss and corresponding current density non-uniformity across the anode. This variation in current density can in turn affect the brightness of the element based on location, thereby creating a non-uniform OLED panel. This is typically not desirable from a product perspective. Therefore, embodiments of the present invention include designs having a purpose of mitigating variations in luminance in large area OLED devices.

In accordance with embodiments, the present invention generally relates to a (usually planar) electrical package for light emission, which comprises a first electrode layer comprising a substantially transparent nonmetallic conductive material. The first electrode layer may be provided as a sheet or a film, optionally disposed on a substrate. A plurality of light emitting elements is disposed on the first electrode layer. Collectively, the plurality of light emitting elements define a luminous region of the package when it is energized. The first electrode layer is generally elongated in such a manner that it comprises a peripheral region (also known as an "edge" or "wing" or "circumference"). When viewed as a plan view (a top view or bottom view, i.e., viewed perpendicular to the plane of the electrical package), such peripheral region is seen to generally "surround" the luminous region. The peripheral region generally defines a nonluminous region of the package. For promotion of current spreading, an elongated bus is disposed on at least a portion of the peripheral region and is adjacent to the first electrode layer. In such manner, the elongated bus may be configured to spread current across a length dimension of said first electrode layer. In this context, "adjacent" may generally refer to immediately adjacent, with no intervening layers that are not part of the elongated bus.

Typically, an elongated bus will be configured to enhance an evenness in luminance across the luminous region of the package. In some embodiments, "even luminance" may be defined as less than about 30% (preferably, less than about 20%) variance in light output, along the longest dimension of any individual light emitting element.

For purposes of this disclosure, an "elongated bus" may be defined as any wire, film, or structure which is directly adjacent to the first electrode layer and which spreads current from a point of current injection, and from thence across a length dimension of the first electrode layer. Such bus is generally a conductor of current. Such elongated bus may be a single layered material, or a multilayered material. An elongated bus usually has to be ductile and/or flexible. It may exist, for example, in the form of a metallic thin film (e.g., a vapor deposited metal) on the first electrode layer, or in the form of a drawn wire, or in the form of a foil adhesively affixed to the first electrode layer. Generally, the meaning of "elongated" in this context may refer to the length of the bus relative to the total length of the peripheral region. Where the peripheral region of the first electrode layer comprises an edge (or circumference) having a first length, the elongated bus may have a second length which is at least about 5%, or at least about 25%, or at least about 50%, that of the first length. Nevertheless, the length of the elongated bus is not necessarily limited to these values.

As noted, the elongated bus is disposed on at least a portion of the peripheral region and is adjacent to the first electrode layer. In a first embodiment wherein the elongated bus comprises a thin film of a conductive material. Such thin film may have a thickness of from about 100 nm to about 1000 nm, or at least about 500 nm; preferably about 500 nm. Such thin film may be a vapor deposited thin film, i.e., the elongated bus has been applied by vapor deposition to a location adjacent at least a portion of the first electrode layer. If employed, vapor deposition may comprise one or more of sputter deposition, e-beam evaporative deposition, and thermal evaporative deposition. Generally, vapor deposition should be performed in such a way that the first electrode layer is kept at (or below) a temperature at which first electrode layer does not substantially decompose, e.g., less than about 100° C. As used herein, the term "vapor deposited bus" refers to an elongated bus applied to the first electrode layer by a vapor deposition step.

Importantly, the present invention includes embodiments wherein the elongated bus is "matched" in electronic properties with the adjacent transparent conductive first electrode, wherein the elongated bus comprises a bus material, and wherein the substantially transparent nonmetallic conductive material has an electron affinity, the bus material has a work function, and the work function is within about 30% of the electron affinity. In some embodiments, the nonmetallic conductive material (e.g., comprises indium tin oxide) has an electron affinity of from 4.0 to 4.8 eV. In such cases, the material from which the elongated bus is made, may be chosen from among materials having a work function of from 4.2 to 4.6 eV. More generally, the material from which the elongated bus is made (the "elongated bus material") may be chosen from among those having a work function within a value of about 30% (more preferably, within about 20%) of the electron affinity of the adjacent transparent nonmetallic material. Matching of work functions generally promotes charge injection across the interface between the elongated bus and the first electrode layer. Alternatively, the elongated bus may be a single layer, or a multilayer with optionally graded properties. That is, a graded multilayer may have one work function at a region distal from the transparent first electrode layer, and a second work function at a region proximate the transparent first electrode layer.

To provide sufficient flexibility, the elongated bus material may have a rigidity modulus of less than about 100 GPa, or more usually, of less than about 50 GPa. In embodiments, the elongated bus material may have an electrical resistivity of between about $1 \times 10^{-8}$ Ohm-m and about $50 \times 10^{-5}$ Ohm-m. In embodiments, the elongated bus material may have a thermal conductivity effective to remove heat from the packages, e.g. preferably a thermal conductivity greater than about 20 W/m-K. The elongated bus material may comprise a metal, or a mixture of metals, and/or a metal alloy. In certain embodiments, the elongated bus material may be selected from the group consisting of Al, Sn, Sb, Ni, Mo, Ga, C, In, Zn, and alloys, composites, and combinations of the foregoing; or the like. These may be in elemental or compound form, but are often in elemental form for enhanced conductivity. Preferably, the elongated bus material should comprise a relatively low melting point material, so that vapor deposition of an elongated bus would not thermally degrade the first electrode layer.

As an alternative embodiment, the elongated bus may take the form of a structure that comprises a conductive adhesive material, such as anisotropic conductive film (ACF), or an isotropic conductive film, or a conductive metal-filled plastic (e.g., silver-filled epoxy). In one embodiment, the elongated bus comprises a sandwich of ACF/Al foil/ACF, that is a strip of aluminum foil sandwiched on both sides by strips of ACF. Often the Al foil may be chosen to have a thickness of from about 10 to about 100 microns, e.g., about 25 micrometers.

In yet another alternative embodiment, both forms of elongated bus may be employed simultaneously. That is, the light emitting electrical package will employ a vapor deposited bus immediately adjacent the transparent first electrode layer, and a conductive adhesive material immediately adjacent the vapor deposited bus. This will be more fully explained below in reference to the figures.

For context, hereinbelow is described additional features of the light emitting electrical package. Typically, the plurality of light emitting elements is tiled and/or arrayed on the first electrode layer. The plurality of light emitting elements is often predominantly located in the luminous region of the package. By arraying a plurality of light emitting elements in a central region of a first electrode layer, the luminous region and nonluminous peripheral region are effectively provided. Although there may be spaces between individual light emitting elements within the luminous region, any dark lines or spots in the luminous region owing to the presence of these spaces may be compensated by tiling the elements very close to one another, and/or by the use of light homogenizers (diffusers and the like) overlaying the package.

In accordance with embodiments of the disclosure, at least one of the light emitting elements may comprise an organic electroluminescent material. In such embodiment, each light emitting element may be termed as an "OLED" or organic light emitting device. The light emitting electrical package as a whole is configured to be flexible and/or conformal; that is, the light emitting package comprises a flexibility sufficient to "conform" to at least one predetermined shape, at least once. For example, a "conformal" light emitting electrical package may be initially flexible enough to wrap around a cylindrical body to form a fixture, and then not be flexed again during its useful lifetime. The light emitting electrical packages according to the present disclosure are generally flexible (or conformable). As used herein, the term "flexible" may generally refer to a device or package which is capable of being bent into a shape having a radius of curvature of less than about 10 cm.

Preferably, the light emitting package may be configured to be a large area light source. As used herein, the term "large area" may generally refer to a device having a dimensional area greater than or equal to about 10 cm$^2$. A large area device generally may refer to a plurality of light emitting devices coupled together to form a generally flexible, generally planar panel having an overall large surface area of light emission.

As generally noted elsewhere, the first electrode layer generally is substantially transparent. In certain embodiments, the first electrode layer may be configured to act as an anode in the package, or in some embodiments, a cathode, or act as both a cathode and an anode in different regions of the package. In many embodiments, the first electrode layer is in the package in the form of a substantially planar sheet (i.e., when the package is not flexed). It may be formed via vapor deposition (e.g., sputtering) or by liquid deposition (e.g., slurry or solution) onto a substrate. The first electrode layer may be patterned or unpatterned.

In many embodiments, processes for fabricating an OLED device (or array of light emitting elements), employ a step of depositing a transparent electrode (usually an anode) layer on a substrate. For many applications where flexibility is important, the substrate can be a plastic such as PET or PEN, or alternatively can be glass. For ITO, one may sputter this substance onto the substrate and then (if desired) structure/pattern the substance layer by a photolithography process. The requirements for a good transparent conductive nonmetallic coating (e.g., ITO) for OLED applications can be summarized by high light transmission (> about 90%), low sheet resistance of 1-50 Ω/sq, high work function (sometimes as high as about 5.0 eV) and low roughness below 1 nm (RMS). However, as a practical matter, such desired parameters are not always easily achieved, especially the sheet resistance, which can vary widely based on processing and films morphology (density/surface roughness etc). Furthermore, transparent conductive nonmetallic coatings are typically brittle and may have defects based on processing condition.

Generally, the anode layer may be comprised of a substantially transparent nonmetallic conductive material. Suitable materials for embodiments of the present disclosure include, but are not limited to, transparent conductive oxides such as indium tin oxide (ITO), indium gallium oxide (IGO), aluminum doped zinc oxide (AZO), fluorine doped tin oxide (FTO), zinc oxide, zinc-oxide-fluoride (fluorine doped zinc oxide), indium doped zinc oxide (IZO), magnesium indium oxide, and nickel tungsten oxide; conductive polymers such as poly(3,4-ethylenedioxythiophene) poly(styrenesulfonate) (PEDOT:PSS); and mixtures and combinations or alloys of any two or more thereof. Other substantially transparent nonmetallic conductive materials would be apparent to those of ordinary skill in the field.

The thickness of the first electrode layer is not particularly limited, but it must generally be not too thick as to inhibit flexibility. In one embodiment, a first electrode layer has a thickness of about 125 nm and comprises indium tin oxide, e.g., indium oxide doped with 2-15% tin.

In accordance with embodiments of the invention, the first electrode layer may carry a plurality of light emitting elements. Generally, at least one of the plurality of light emitting elements comprises a transparent conductive electrode layer (usually an anode); a second electrode layer (usually a cathode); and an electroluminescent material layer disposed between the transparent conductive electrode layer and the second electrode layer. Such structure is well known, in general, to persons in the field of organic light emitting devices, and need not be explained in detail. Typically, the electroluminescent material is an organic molecule and/or organic polymer. In accordance with embodiments, at least a portion of the first electrode layer may function as the transparent conductive electrode layer of at least one of the plurality of light emitting elements. The plurality of light emitting elements may be electrically coupled together in a serial, a parallel, or a series-parallel arrangement.

As would be readily understood by persons skilled in the art, such organic emitting elements may require an organic light emitting layer. The organic light-emitting layer may comprise a single layer or two or more sublayers to cooperate with first and second electrodes to emit light. An "organic light-emitting layer" may include an organic electroluminescent light emitting layer, an optional hole injecting layer, an optional hole transporting layer, an optional electron transporting layer and an optional electron injecting layer. First and second electrodes inject charge carriers, i.e., holes and electrons, into the organic light-emitting layer where they recombine to form excited molecules or excitons, which emit light when the molecules or excitons decay. The color of light emitted by the molecules depends on the energy difference between the excited state and the ground state of the molecules or excitons. In non-limiting examples, the organic light emitting layer may have a thickness of about 50-500 nanometers, and the electrodes each may have a thickness of about 100-1000 nanometers.

Cathodes generally may comprise a material having a low work function such that a relatively small voltage causes the emission of electrons. Commonly used materials include metals, such as gold, gallium, indium, manganese, calcium, tin, lead, aluminum, silver, magnesium, lithium, strontium, barium, zinc, zirconium, samarium, europium, and mixtures or alloys of any two or more thereof. In embodiments of the invention, the cathode generally may comprise a material having a low work function value such that a relatively small voltage causes emission of electrons from the cathode. Alternatively, the cathode may be made of two layers to enhance electron injection. Non-limiting examples of the cathode may comprise a thin inner layer of LiF followed by a thicker outer layer of aluminum, or a thin inner layer of calcium followed by a thicker outer layer of aluminum or silver.

In certain embodiments, the organic light-emitting layer is built up over the first electrode layer by a solution-phase deposition, followed by solvent-assisted wiping or other patterning, and then a cathode layer is deposited over the organic light-emitting layer by a vapor deposition, e.g., 100-1000 nm thick aluminum film. In one embodiment, the electrical package comprises a continuous unpatterned anode layer and a discontinuous cathode layer configured in a plurality of ribbon-like structures. The term 'ribbon-like' refers to the dimensions of lighted areas of the device, which may be long and narrow and thin in cross-section. The ribbons may be continuous. A ribbon design may be beneficial for fabrication in a continuous roll to roll process.

Organic light emitting electrical packages are typically encapsulated or hermetically sealed since moisture and oxygen may have an adverse impact on the OLED device. One or more OLED device may be sealed, e.g., adhesively sealed, between two (or more) generally impermeable layers (e.g., films), at least one of which is transparent to allow the generated light to escape. In many embodiments, one of these impermeable layers is a transparent barrier, and another is a backlayer.

A typical transparent layer may be a transparent barrier, e.g., transparent ultrahigh barrier (UHB) film as is generally known in the art, and particular details of the structure and function of the UHB are shown and described in commonly owned U.S. Pat. No. 7,015,640.

A backlayer (or backsheet) may typically include a metal foil, such as aluminum foil or other conductive material, that is coated on both surfaces with a polymer insulator. In some embodiments, the backlayer may be a composite assembly that includes a metal foil that is encased or encapsulated within a polymer film or insulator on opposite faces of the metal foil. The backlayer generally exhibits excellent moisture and oxygen barrier characteristics due to the incorporation of a metal foil. Some suitable materials for use as backlayer include commercially available multilayer packaging or lidding materials having moisture- and optionally oxygen-barrier properties in the form of films or sheets, such as heat-sealable materials. One example of a suitable material is Tolas TPC-0814B lidding foil, produced by Tolas Healthcare Packaging, Feasterville, Pa., USA, a division of Oliver-Tolas, Grand Rapids, Mich., USA.

An adhesive, where employed to seal the transparent barrier to the backlayer, may be selected for low cost, easy processing in large areas as well as transparency, low moisture permeability, and good adhesion, and may have capacities to absorb moisture and/or oxygen. In non-limiting examples, a suitable adhesive material may comprise a polymeric material, such as epoxy, acrylic urethane, silicone, rubber, vinyl, or polyolefin.

Various electrical pathways must be established in the light emitting electrical package. One manner of establishing an electrical pathway with a light emitting package is to form openings, vias, or feedthrough apertures at selected spaced locations in an otherwise impermeable backlayer. The apertures may be formed in the backlayer using any suitable method, such as punching, die cutting, laser machining, lithographic etching, or so forth. The apertures can be round or of another lateral geometry or shape, can be of varied diameter or size, or of other shapes and aspect ratios depending on the layout of the package and other design factors. Electricity can be provided to the encapsulated light emitting elements through openings (feedthrough apertures) in the backlayer. Conductive patches may be used to cover the openings of the backlayer to provide an electrical pathway into the hermetic package.

Some suitable methods and systems for using an aperture and a patch to connect to a device and to form a hermetic package are described in US Published Patent Applications 2010-0295443-A1, 2010-0296261-A1, and 2010-00294526-A1, the entire contents of each of which is hereby incorporated by reference. Patches corresponding to apertures suitably comprise conductive foil elements (such as aluminum, stainless steel, nickel, or brass) of sufficient thickness and homogeneity to be impermeable to moisture or other detrimental environmental contaminants. As used herein, the term "patch" refers to a piece or sheet of electrically conductive material used to cover at least one aperture in a backlayer. To facilitate sealing, patches may be sized to be substantially larger than respective apertures. Patches may be suitably die cut from a foil sheet or otherwise fabricated, and should be sufficiently planar to facilitate hermetic sealing of the respective aperture(s).

An outcoupling layer may be placed in the path of light extraction of the light emitting electrical package, to assist in removal or extraction of light. As one skilled in the art recognizes, the outcoupling layer may be in the form of a film, to extract light that is trapped within. An outcoupling layer may comprise scattering particles, or surface texturing such as micro lenses or prisms, which increase the amount of light emitted from the device.

In embodiments of the invention, the package may further comprise a getter material disposed between the transparent barrier layers and the backlayer to absorb moisture and/or oxygen. The getter material may be disposed at different positions and with different amounts. In certain embodiments, the getter material may be transparent and selected from material, such as certain alkaline earth metal oxides, or from various metallic elements.

Referring now to FIG. 1, herein is shown a cross-sectional depiction of one embodiment of an idealized light emitting element 100. Generally, such element may be supported on a optional (glass or plastic) substrate 101, upon which is disposed a transparent ultra-high barrier layer 102. Anode layer 103 (generally a transparent electrode comprising a transparent nonmetallic conductive material) is adjacent barrier layer 102, and is provided with a conducting anode contact 104 for facilitating current flow. Generally sandwiched between (or simultaneously adjacent to both) anode layer 103 and cathode layer 106 is an organic electroluminescent material layer 105, which may be a single layer or multiple layers with charge-modifying agents, fluorescent materials, or other materials optionally present. To facilitate current flow, cathode layer 106 may be provided with a conductive cathode contact 107.

To provide further barrier properties a cathode cap 108 is schematically shown. Although not specifically depicted in FIG. 1, it is understood that cathode cap 108 may also extend further to the right so as to more fully cover cathode 106 to mitigate possible electrical shorting issues. It is understood that this configuration is intended to set forth only the most important of the basic electrically active elements of a light emitting electrical package; other barriers, sealants, electrical interconnections, light-modification layers, and adhesives, and the like may be provided, as would be readily understood by persons skilled in the art.

Figure 2:
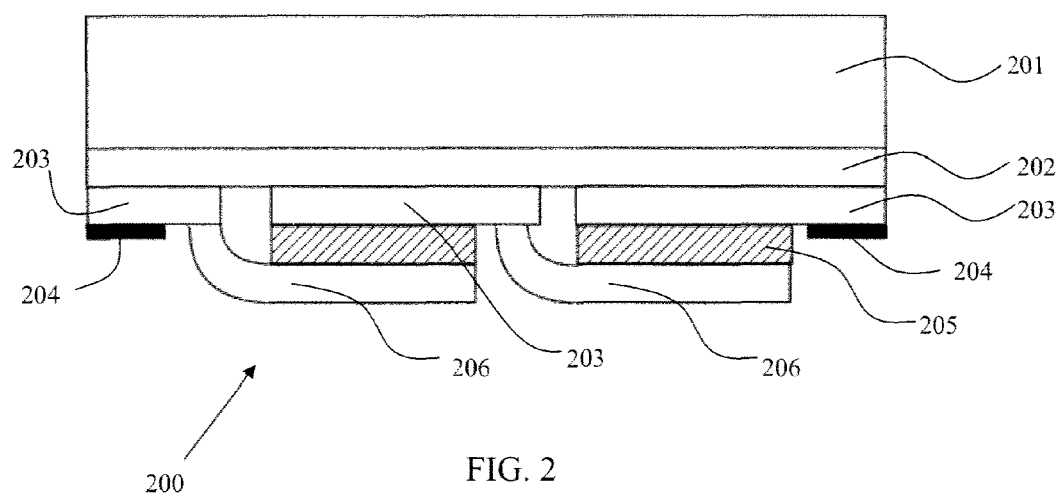
FIG. 2 depicts a serial electrical connection suitable for an array of light emitting elements.

A plurality of light emitting elements, such as one which is shown as 100 in FIG. 1, may be arrayed in an electrical package and interconnected, so as to increase the size of the luminous region of a large area light emitting package. To facilitate reliable electrical connectivity between individual elements, elements may be interconnected in a serial, parallel, or series/parallel fashion, as generally understood by those skilled in the field. FIG. 2 depicts a cross-sectional view of an idealized serial array 200 of two light emitting elements, disposed on a transparent barrier layer 202 supported by substrate 201. Adjacent to barrier layer 202 is disposed a transparent anode layer 203, which may be patterned or unpatterned. Layer 205 is an organic electroluminescent material layer and 206 is a cathode layer. Cathode layer 206 of each individual element is electrically connected serially to anode layer 203 of an adjacent element. In this fashion, electrical connection to external bussing elements (and power) may be made solely or predominantly to anode layer 203 at various points, facilitated by optional conductive anode contacts 204. Such a series connection, wherein anode contacts are disposed in close proximity to the perimeter of substrate 201, is suited to packaging techniques that provide feedthrough connections through the periphery of the package.

Figure 3:
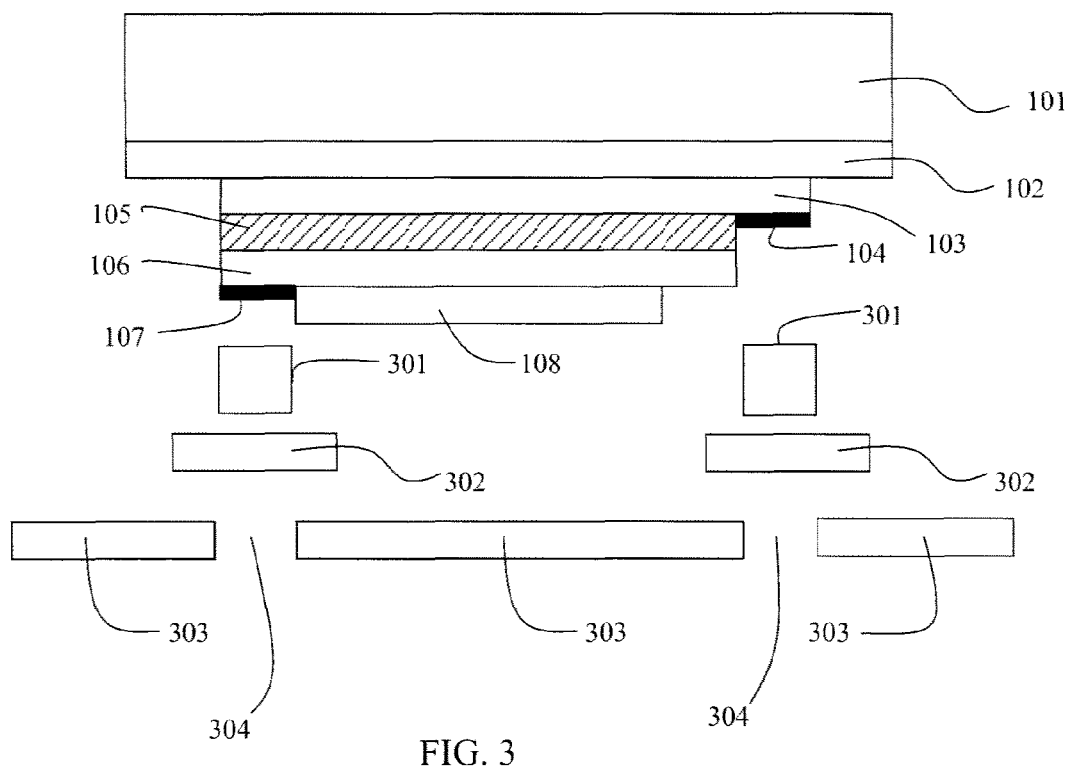
FIG. 3 illustrates a sectional view of a feedthrough configuration for a typical light emitting element.

Feedthrough connection refers to an arrangement wherein current is passed from external bussing elements through one or more aperture in a backlayer to electrode contacts of a light emitting element. Illustrative of such arrangement is shown in FIG. 3. Adopting the numbering of FIG. 1, a light emitting element is supported on a optional (glass or plastic) substrate 101, upon which is disposed a transparent ultra-high barrier layer 102. Anode layer 103 is adjacent barrier layer 102, and is provided with a conducting anode contact 104. Generally sandwiched between anode layer 103 and cathode layer 106 is an organic electroluminescent material layer 105. To facilitate current flow, cathode layer 106 may be provided with a conductive cathode contact 107. To provide further barrier properties, cathode cap 108 is provided; although not specifically depicted, it is understood that cathode cap 108 may also extend further to more fully cover cathode 106. Backlayer 303 together with ultra-high barrier 102 may be used to encapsulate the light emitting element. Backlayer 303 is provided with apertures 304 through which external conductive lines (not specifically shown) may be fed. Oversize conductive patches 302 are provided either inside (as shown) or outside (not specifically shown) backlayer 303, to seal the apertures 304 from ingress of moisture and/or oxygen, and to conduct current from external conductive lines. Patches 302 may be sealingly laminated to the electrode contacts 104, 107 of the package with the assistance of an optional conductive adhesive 301, which may be made of silver-filled epoxy, of an or anisotropic or isotropic conductive film.

Figure 4:
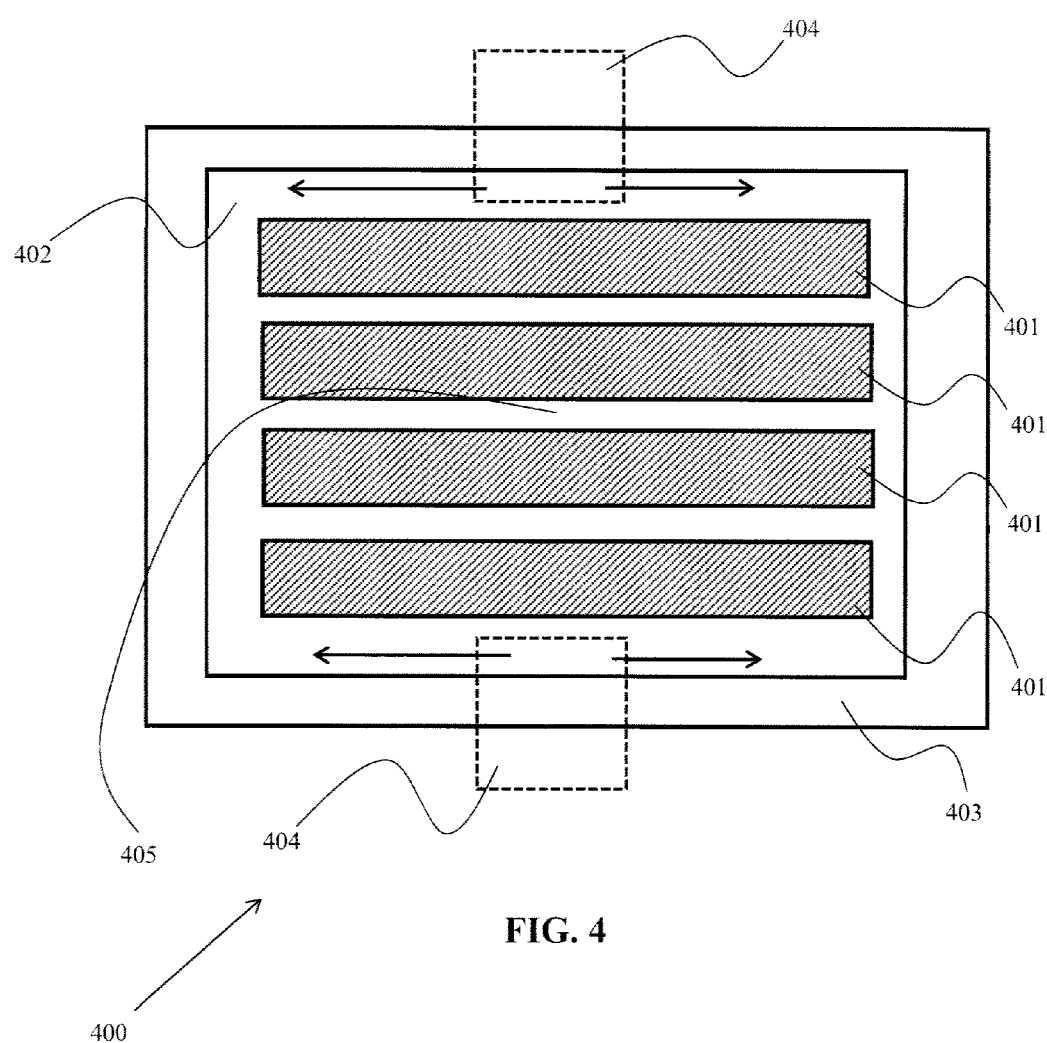
FIG. 4 is a top plan view of an array of light emitting elements with conductive patch.

FIG. 4 is a schematic, top plan view of a plurality of light emitting elements 401 arrayed as ribbons to form a light emitting electrical package 400. The elements 401 are disposed on a transparent anode layer 402 (composed of a substantially transparent nonmetallic conductive material such as indium tin oxide) and optional substrate 403. Collectively, the light which is emitted from the plurality of light emitting elements 401 form a luminous region, the center of which is generally at point 405. To feed current to the backside of anode layer 402, conductive patches 404 are provided and shown as a phantom outline, since in this view they are below the plane of the anode layer 402. There may be more than two conductive patches in the package, in this position and/or other positions. The two patches 404 are shown as provided on a periphery of anode layer 402, not within the light path of the package (i.e., outside of the luminous region of the package 400), at a nonluminous region of the anode layer 402. The horizontal arrows emanating from the phantom outline depiction of patches 404, are intended to be a cartoon depiction of current flow from the patches 404 outwardly through the length of anode layer 402. Due to the generally high sheet resistance of the transparent anode layer 402, the magnitude of the current injected from the patches will be generally highest at a region of the anode layer 402 which is closest to the patches 404, and will decrease at increasing distances from the patches 404. This decreasing current will result in a corresponding decrease in luminance at increasing distance from the center 405 of the luminous region.

Figure 5:
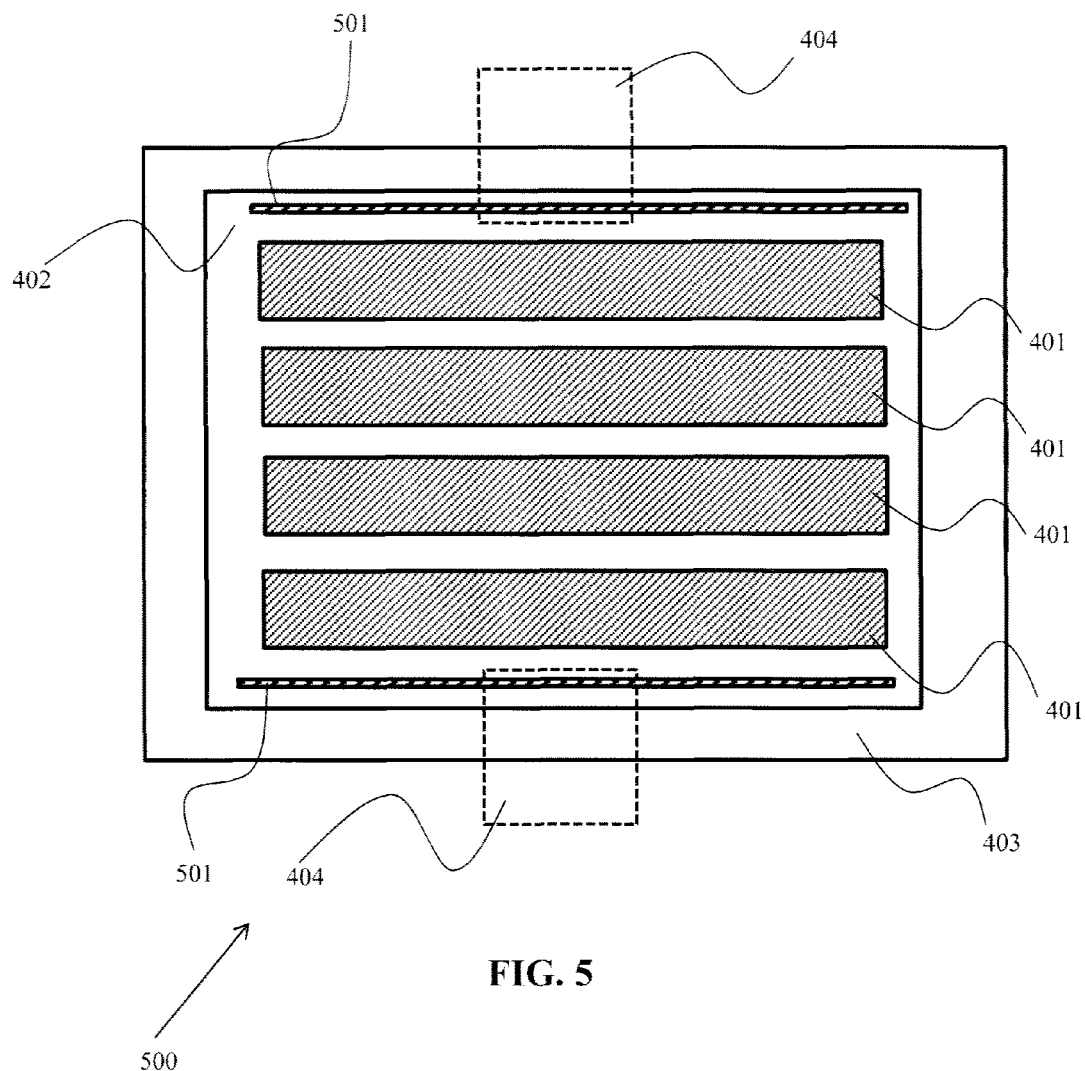
FIG. 5 is a top plan view of an elongated bus configured for use with an array of light emitting elements, in accordance with embodiments of the invention.

Embodiments of the present invention provide an elongated bus configured to spread current across a length dimension of the first electrode layer, e.g., a transparent conductive anode layer. This is schematically shown in top plan view of FIG. 5, in which the numbering scheme of FIG. 4 is adopted to show like elements. To facilitate current spreading from conductive patches 404, one or more elongated bus 501 is disposed on at least a portion of the peripheral region of layer 402. Although such bus is shown as a thin rectangular strip, it may take any shape effective for its utility. Resulting light emitting electrical package 500 will generally exhibit a more even luminance across the luminous region of the package.

Figure 6:
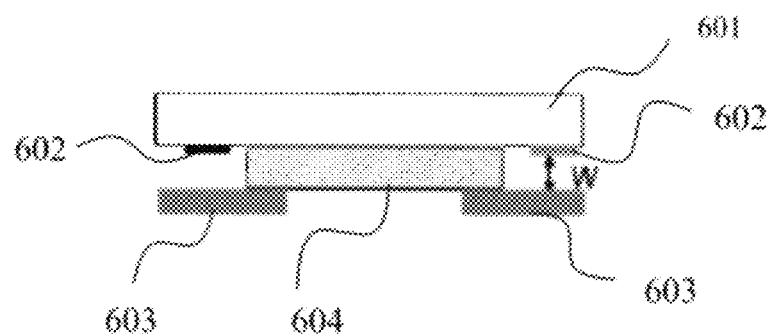
FIG. 6 is a sectional view a light emitting element with vapor deposited bus, in accordance with embodiments of the invention.
Figure 7:
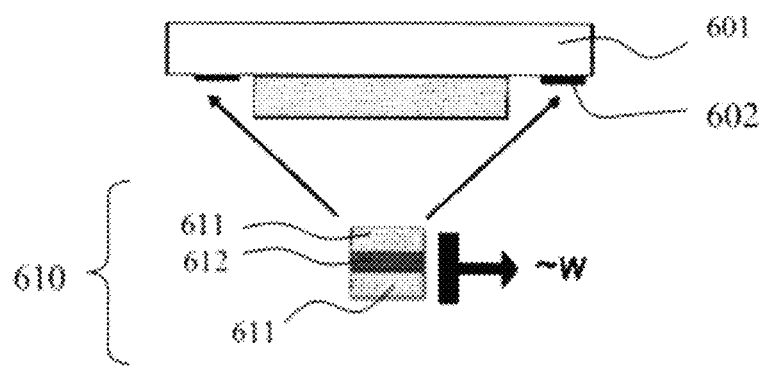
FIG. 7 is sectional view of a supplemental multilayer bus for use with vapor deposited bus, in accordance with embodiments of the invention.

FIG. 6 represents a cross-sectional schematic view of the simultaneous use of both a vapor-deposited bus and conductive tape as an elongated bus. A vapor-deposited metal film 602, typically of ca. 500 nm thickness, is supported on substrate or transparent anode 601. Conductive patches 603 exist to provide current to an anode through a current-spreading vapor-deposited metal film 602. Yet, owing to the common use of caps or barriers 604 (or other mechanical impediments), gaps of width "W" may exist between conductive patches 603 and the vapor-deposited metal film 602. Therefore, in FIG. 7, a supplemental bus 610 of thickness comparable to "W", may be inserted into the gap between patch 603 and vapor-deposited film 602. The supplemental bus 610 may have a three-layer construction in which a metal foil 612 is sandwiched between two layers of anisotropic conductive film 611. Inclusion of supplemental bus 610 may also provide mechanical stability to electrical packages. For instance, in FIG. 6, in the absence of a supplemental bus, one may envision delamination of patch 603 from bus 602 occurring upon flexing or bending of a large area, planar flexible electrical package. This delamination could result in an open circuit, and no light would be emitted from the OLED. This problem can be mitigated by filling in the gap of width "W", in the manner shown. The bus may impart additional mechanical retentive force to the encapsulated electrical package, in combination with the cathode cap, barrier layers, adhesives, and backlayer. Of course, one may also incorporate a bus that is slightly thicker than the gap (W). This would have an effect such that the electrical contacts are in residual compression, thereby creating a strong and robust electrical contact. This may be important in flexible applications: without residual compression, the electrical connection may suffer separation or delamination, resulting in an open circuit and no light output.

Figure 8:
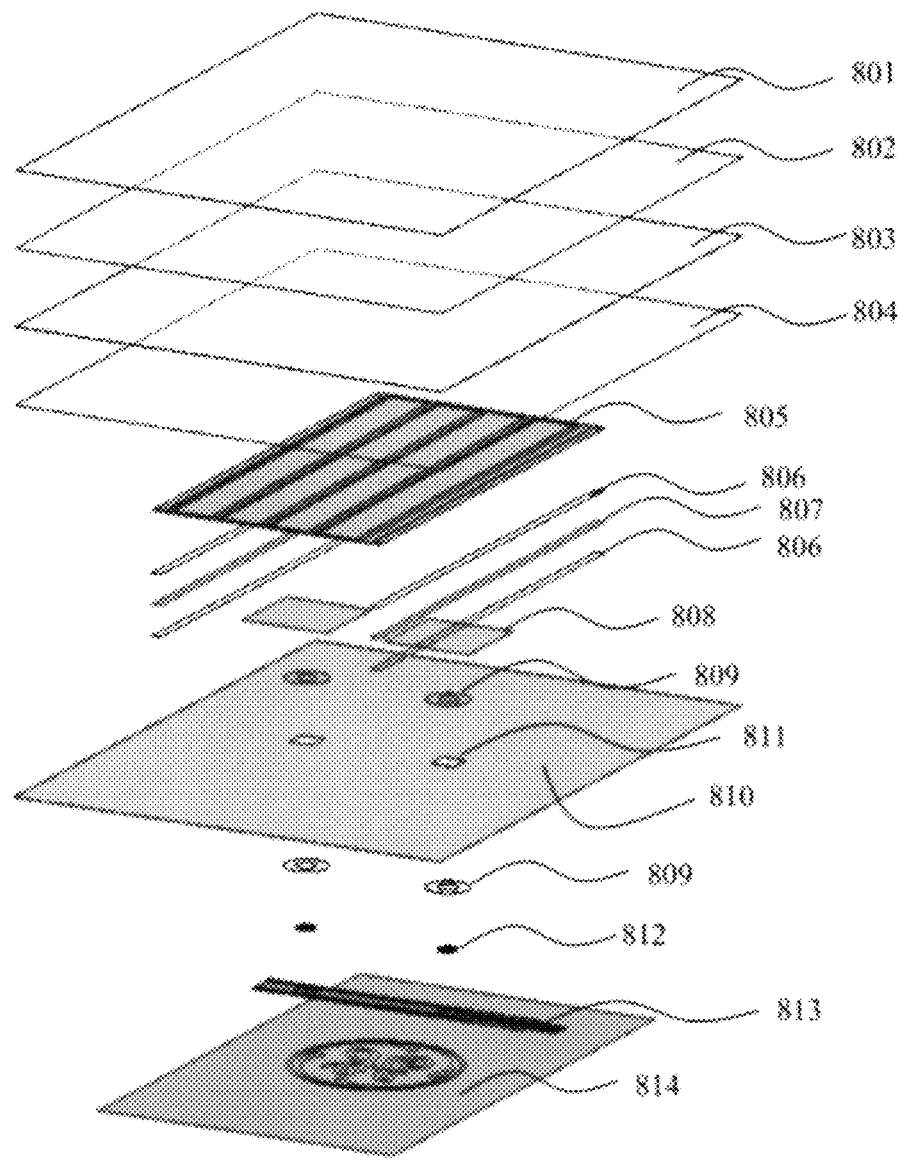
FIG. 8 is an exploded view of an encapsulated light emitting package, in accordance with embodiments of the invention.

FIG. 8 is an exploded view of a light emitting electrical package according to embodiments of the invention, with particular attention to the placement of an elongated bus along a periphery. The order in which the features of FIG. 8 are described is not intended to denote the particular order in which the respective features are built up into a complete package. Beginning at the bottom, there is a mask 814 and flat flexible cable 813 (which is an example of what has been denoted as an "external bussing element" elsewhere in this disclosure). Essentially, cable 813 is representative of one or more external conductive wiring elements which carry current from drivers, controllers, and/or power sources (not specifically shown), which may exist external to a hermetically sealed package. (A more detailed description of some suitable types of flat flexible cables and connection schemes for organic light emitting devices, may be found in commonly assigned U.S. patent application Ser. No. 12/644,520 filed 22 Dec. 2009, which is hereby incorporated by reference).

Continuing with FIG. 8, item 805 depicts the plurality of light emitting elements, shown here illustratively as four ribbons. At opposite edges (peripheries) of item 805 are disposed elongated busses, which, in this embodiment, take the form of thin strips comprising foil 807 sandwiched between two strips of anisotropic conductive film 806. Each elongated bus sits between the plurality 805 of light emitting elements and the conductive patch 808. To prevent shorts, the conductive patch 808 may be provided with an insulating ring 809 between the patch 808 and the backlayer 810. The patch covers the aperture 811 in the backlayer 810. From the opposite side of the backlayer 810, cable 813 is made to be in electrical communication with patch 808 through the use of an amount of silver-epoxy conductive adhesive 812. Another optional insulating ring 809 may be positioned for prevention of shorts. Moving to the top side of the plurality 805 of light emitting elements, at the upper portion of FIG. 8, an optical coupling film 804 may be disposed over the plurality 805 of light emitting elements, with a transparent ultra-high barrier 803 over the optical coupling film 804. Finally, outcoupling film 801 may be affixed over transparent ultra-high barrier 803 through the use of outcoupling adhesive 802.

To summarize, applicants of the present invention have devised elongated bus structures intended to reduce the resistive losses along a transparent nonmetallic conductive contact at its edge or periphery. Bus designs have been devised to enable current spreading, as well as to minimize losses in the system due to energy level differences. One design for an elongated bus comprises: (1) a conductive adhesive/metal foil/conductive adhesive sandwich structure; (2) another design comprises a vapor deposited bus of one or more materials; and a further design employs (1) and (2) in tandem.

Some embodiments disclosed herein are capable of advantageously achieving a more uniformly illuminated OLED. As a result, customers will generally perceive such uniformly-lit large area OLEDs as being aesthetically superior. Furthermore if the current is spread more uniformly across the device, then any adventitious luminance degradation over time will be more uniform.

As used herein, approximating language may be applied to modify any quantitative representation that may vary without resulting in a change in the basic function to which it is related. Accordingly, a value modified by a term or terms, such as "about" and "substantially," may not be limited to the precise value specified, in some cases. The modifier "about" used in connection with a quantity is inclusive of the stated value and has the meaning dictated by the context (for example, includes the degree of error associated with the measurement of the particular quantity). "Optional" or "optionally" means that the subsequently described event or circumstance may or may not occur, or that the subsequently identified material may or may not be present, and that the description includes instances where the event or circumstance occurs or where the material is present, and instances where the event or circumstance does not occur or the material is not present. The singular forms "a", "an" and "the" include plural referents unless the context clearly dictates otherwise. All ranges disclosed herein are inclusive of the recited endpoint and independently combinable.

As used herein, the phrases "adapted to," "configured to," and the like refer to elements that are sized, arranged or manufactured to form a specified structure or to achieve a specified result. While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims. It is also anticipated that advances in science and technology will make equivalents and substitutions possible that are not now contemplated by reason of the imprecision of language and these variations should also be construed where possible to be covered by the appended claims.

What is claimed as new and desired to be protected by Letters Patent of the United States is:

1. A light emitting electrical package, comprising:
   a first electrode layer comprising a substantially transparent nonmetallic conductive material, and
   a plurality of light emitting elements disposed on said first electrode layer, the plurality of light emitting elements defining a luminous region of the package when energized;
   wherein said first electrode layer comprises a peripheral region, and wherein a vapor deposited elongated bus is disposed on at least a portion of the peripheral region and adjacent the first electrode layer; and
   wherein said elongated bus is configured to spread current across a length dimension of said first electrode layer;
   wherein said vapor deposited elongated bus comprises a thin film of a conductive material, the thin film having a thickness of about 100 nm to about 1000 nm;
   and wherein the light emitting electrical package further comprises a supplemental elongated bus adjacent the thin film, the supplemental elongated bus comprising a structure of a metal foil sandwiched between films of conductive adhesive material.

2. The light emitting electrical package in accordance with claim 1, wherein at least one of the light emitting elements comprises an organic electroluminescent layer and a second electrode layer, the organic electroluminescent layer sandwiched at least in part between the first electrode layer and the second electrode layer.

3. The light emitting electrical package in accordance with claim 1, wherein the electrical package is configured to be flexible and/or conformal, and is part of a large area device.

4. The light emitting electrical package in accordance with claim 1, wherein at least a portion of the peripheral region is a nonluminous region of the package, and wherein said elongated bus is disposed at least partially in said nonluminous region.

5. The light emitting electrical package in accordance with claim 1, wherein said elongated bus comprises a ductile and/or flexible structure, and is conductive, and is configured to enhance an even luminance across the luminous region of the package.

6. The light emitting electrical package in accordance with claim 1, wherein the elongated bus comprises a bus material, and wherein the substantially transparent nonmetallic conductive material has an electron affinity, the bus material has a work function, and the work function is within about 30% of the electron affinity.

7. The light emitting electrical package in accordance with claim 1, wherein the elongated bus comprises a bus material having a rigidity modulus of less than about 100 GPa.

8. The light emitting electrical package in accordance with claim 1, wherein the elongated bus comprises a bus material selected from the group consisting of Al, Sn, Sb, Ni, Mo, Ga, C, In, Zn, and alloys, composites, and combinations of the foregoing.

9. The light emitting electrical package in accordance with claim 1, wherein the plurality of light emitting elements are electrically coupled in a serial, parallel, or a series-parallel arrangement.

10. The light emitting electrical package in accordance with claim 1, wherein the nonmetallic conductive material comprises a transparent conductive oxide or a transparent conductive organic polymer.

11. The light emitting light emitting electrical package of claim 1, further comprising a transparent barrier and a backlayer for encapsulation of the plurality of light emitting elements.

12. The light emitting light emitting electrical package of claim 11, wherein the backlayer comprises at least one feedthrough aperture to facilitate electrical coupling of the plurality of light emitting elements to an external bus, and wherein a conductive patch is electrically coupled to an anode or a cathode of the package and covers at least one feedthrough aperture.

13. The light emitting light emitting electrical package of claim 12, wherein the conductive patch is in electrical communication with the elongated bus.

14. A large area conformal light emitting electrical package, comprising:
   a generally planar anode layer comprising a transparent conductive oxide, and
   a plurality of organic light emitting elements disposed on said anode layer, wherein at least one of the light emitting elements comprises an organic electroluminescent layer and a cathode layer, the plurality of light emitting elements defining a luminous region of the package when energized;
   wherein said anode layer further comprises a nonluminous peripheral region, and wherein a vapor deposited elongated bus is disposed on at least a portion of the nonluminous peripheral region and adjacent the anode layer,
   wherein the elongated bus comprises a bus material, wherein the transparent conductive oxide has an electron affinity, the bus material has a work function, and the work function is within about 30% of the electron affinity; and
   wherein said elongated bus is configured to spread current across a length dimension of said anode layer;
   wherein said vapor deposited elongated bus comprises a thin film of a conductive material, the thin film having a thickness of about 100 nm to about 1000 nm; and
   wherein the light emitting electrical package further comprises a supplemental elongated bus adjacent the thin film, the supplemental elongated bus comprising a structure of a metal foil sandwiched between films of conductive adhesive material.

* * * * *